(12) United States Patent
Igeta et al.

(10) Patent No.: US 7,378,358 B2
(45) Date of Patent: May 27, 2008

(54) METHOD FOR FORMING INSULATING FILM ON SUBSTRATE, METHOD FOR MANUFACTURING SEMICONDUCTOR DEVICE AND SUBSTRATE-PROCESSING APPARATUS

(75) Inventors: Masanobu Igeta, Nirasaki (JP);
Shintaro Aoyama, Nirasaki (JP);
Hiroshi Shinriki, Matsudo (JP)

(73) Assignee: Tokyo Electron Limited, Tokyo (JP)

( * ) Notice: Subject to any disclaimer, the term of this patent is extended or adjusted under 35 U.S.C. 154(b) by 220 days.

(21) Appl. No.: 10/527,642

(22) PCT Filed: Sep. 19, 2003

(86) PCT No.: PCT/JP03/11971

§ 371 (c)(1),
(2), (4) Date: Mar. 14, 2005

(87) PCT Pub. No.: WO2004/027852

PCT Pub. Date: Apr. 1, 2004

(65) Prior Publication Data

US 2006/0009044 A1 Jan. 12, 2006

(30) Foreign Application Priority Data

Sep. 19, 2002 (JP) .............................. 2002-273709

(51) Int. Cl.
*H01L 21/469* (2006.01)
(52) U.S. Cl. ...................... 438/786; 438/765; 438/769; 257/E21.625; 257/E21.639

(58) Field of Classification Search ................ 438/765, 438/771, 772, 776, 777; 257/E21.615
See application file for complete search history.

(56) References Cited

U.S. PATENT DOCUMENTS

| | | | |
|---|---|---|---|
| 6,459,126 B1* | 10/2002 | Mogami et al. | 257/350 |
| 6,511,539 B1* | 1/2003 | Raaijmakers | 117/102 |
| 2001/0041250 A1* | 11/2001 | Werkhoven et al. | 428/212 |
| 2003/0146310 A1* | 8/2003 | Jackson | 239/690 |

FOREIGN PATENT DOCUMENTS

| | | |
|---|---|---|
| JP | 2001-44419 | 2/2001 |
| JP | 2001-85427 | 3/2001 |
| JP | 2002-134503 | 5/2002 |

* cited by examiner

*Primary Examiner*—Michael Lebentritt
*Assistant Examiner*—Cheung Lee
(74) *Attorney, Agent, or Firm*—Oblon, Spivak, McClelland, Maier & Neustadt, P.C.

(57) ABSTRACT

A substrate-processing apparatus (100, 40) comprises a radical-forming unit (26) for forming the nitrogen radicals and oxygen radicals through a high-frequency plasma, a processing vessel (21) in which a substrate (W) to be processed is held, and a gas-supplying unit (30) which is connected to the radical-forming unit. The gas-supplying unit (30) controls the mixture ratio between a first raw material gas containing the nitrogen and a second raw material gas containing oxygen, and supplies a mixture gas of a desired mixture ratio to the radical-forming unit. By supplying the nitrogen radicals and oxygen radicals mixed at the controlled mixture ratio to the surface of the substrate, an insulating film having a desired nitrogen concentration is formed on the surface of the substrate.

3 Claims, 15 Drawing Sheets

FIG. 7

| | IONIZATION ENERGY CONVERSION EFFICIENCY | RANGE OF DISCHARGE-ENABLING PRESSURE | PLASMA POWER CONSUMPTION | PROCESS GAS FLOW RATE |
|---|---|---|---|---|
| MICROWAVE | 1.00E-02 | 0.1m~0.1Torr | 1~500W | 0~100sccm |
| RF | 1.00E-07 | 0.1~100Torr | 1~10kW | 0.1~10slm |

FIG.8
(A)
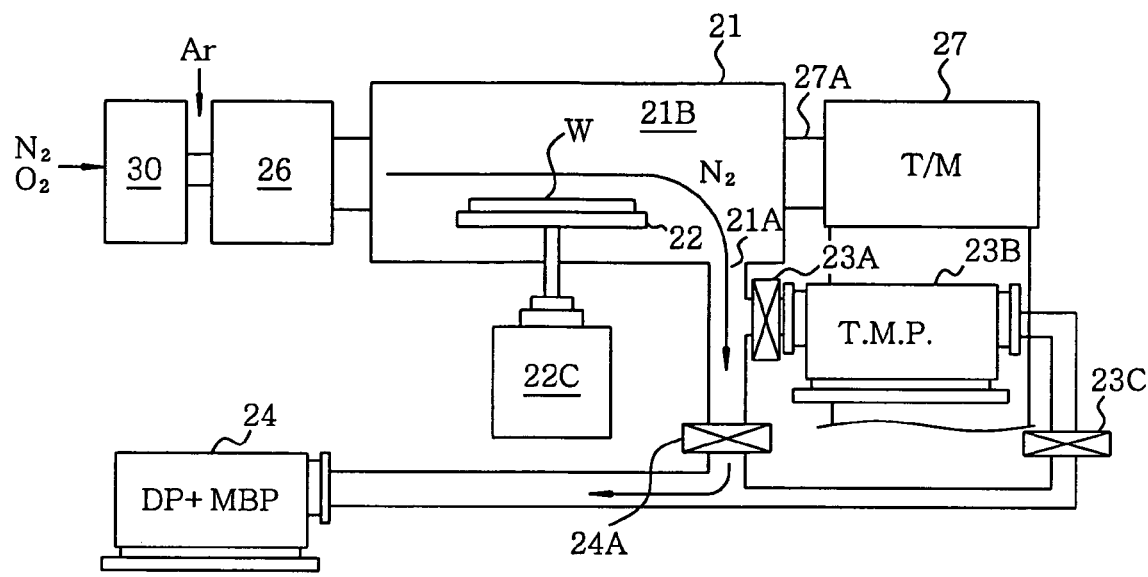
(B)
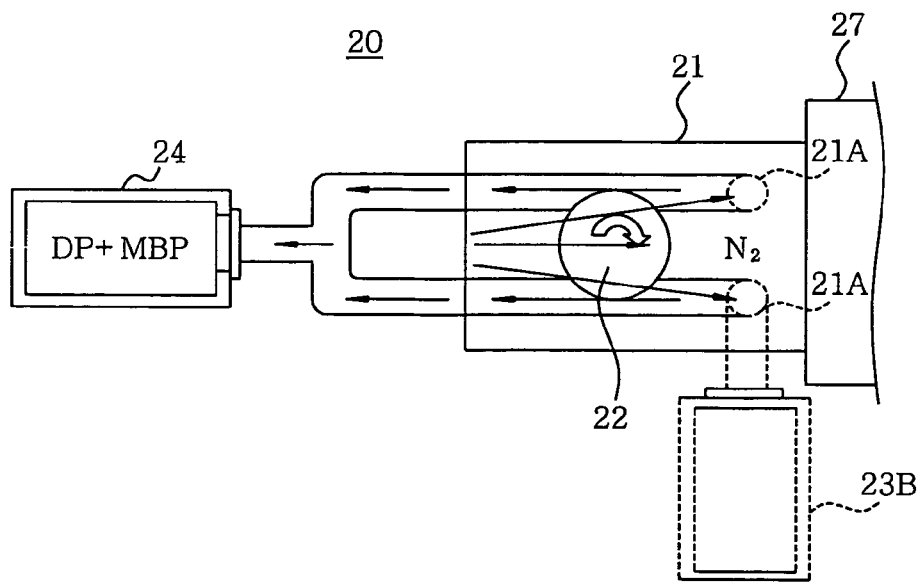

FIG.9
(A)
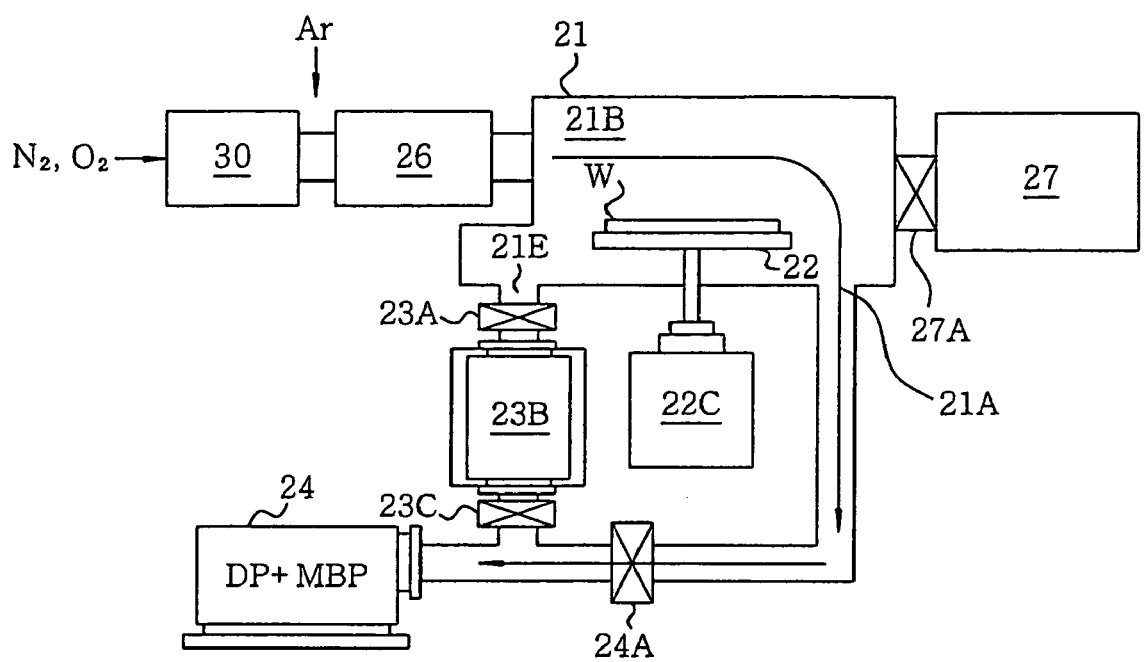
(B)
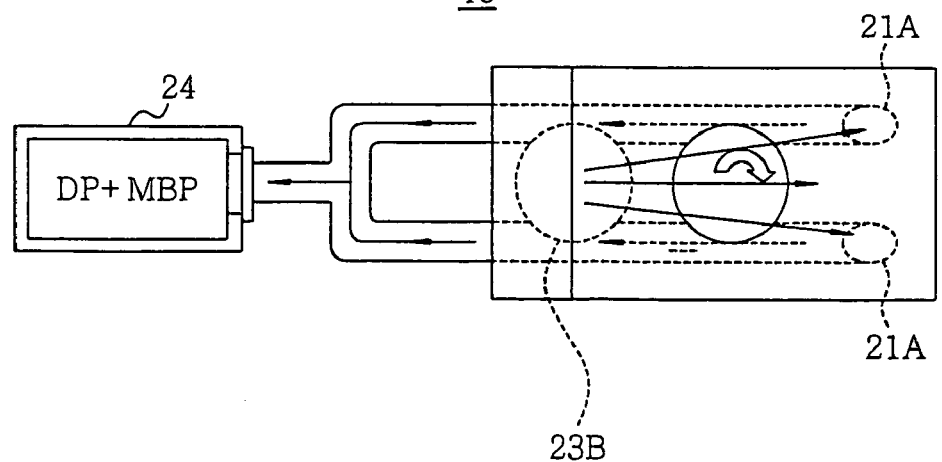

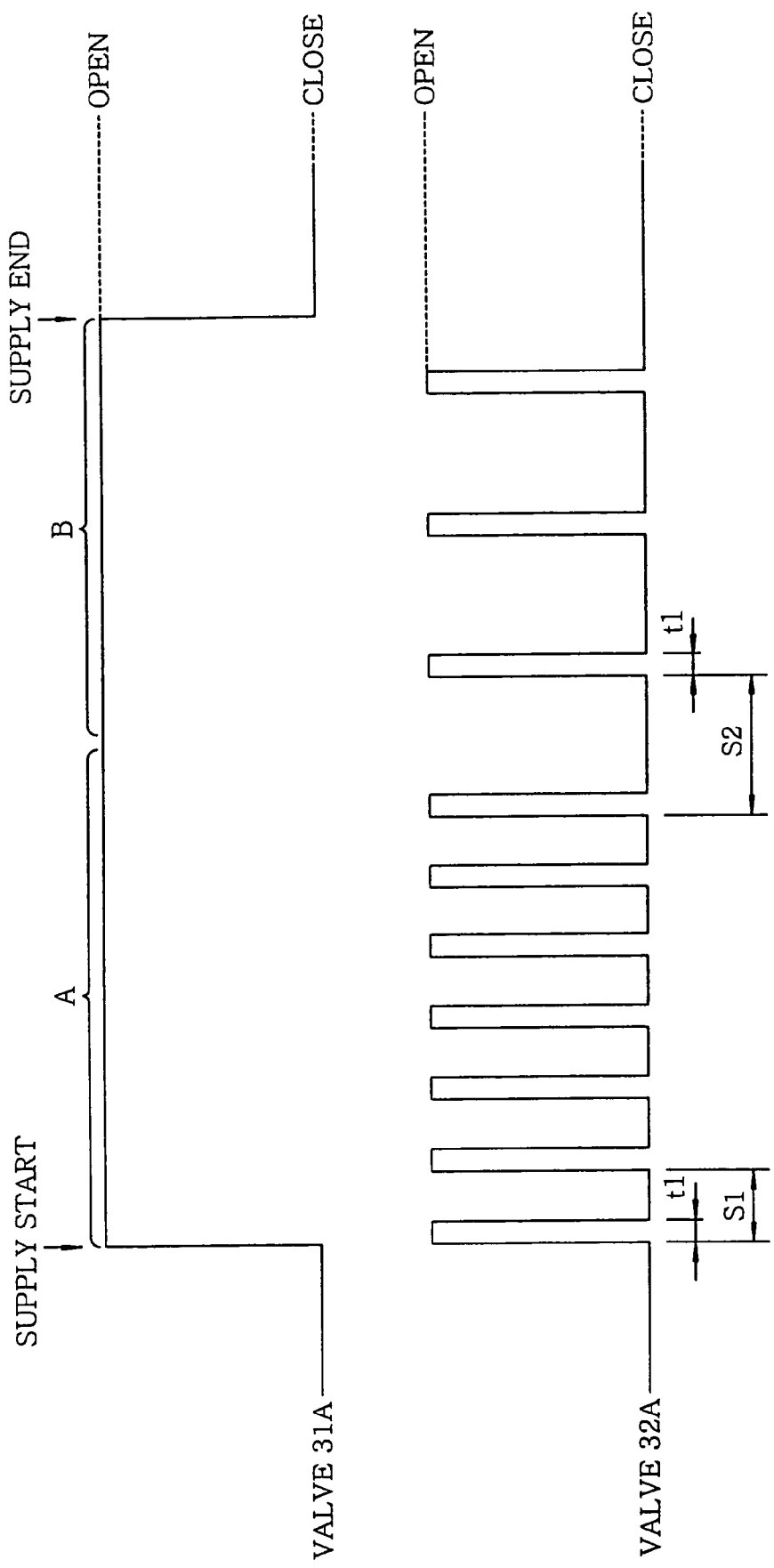

METHOD FOR FORMING INSULATING FILM ON SUBSTRATE, METHOD FOR MANUFACTURING SEMICONDUCTOR DEVICE AND SUBSTRATE-PROCESSING APPARATUS

FIELD OF THE INVENTION

The present invention relates to a method for manufacturing a semiconductor device; and, more particularly, to a substrate processing technique of a super miniaturized high speed semiconductor device wherein a high-k dielectric film is employed as a gate insulating film.

BACKGROUND OF THE INVENTION

With the advancement in the miniaturization process technology, it has become feasible to use a gate length of 0.1 µm or less in an ultra high speed semiconductor device. Generally, the operating speed of a semiconductor device is improved with the miniaturization thereof. However, in such a highly miniaturized semiconductor device, the thickness of a gate insulating film needs to be reduced in proportion to the reduction in the gate length in accordance with the scaling rule.

In case the gate length is reduced to 0.1 µm or less, the thickness of the gate insulating film needs to be 1-2 nm or less on a conventional thermal oxide film basis. However, such an extremely thin gate insulating film cannot avoid the problem of increased gate leakage current resulting from an increase in the tunneling current.

Accordingly, it has been proposed to employ a high-k dielectric material having a substantially higher dielectric constant than the thermal oxide film for use as a gate insulating film. Specifically, $Ta_2O_5$, $Al_2O_3$, $ZrO_2$, $HfO_2$, $ZrSiO_4$, $HfSiO_4$ and the like have been tried for such purpose, as they are small in terms of the thickness electrically equivalent to $SiO_2$ despite their large actual thickness. With the use of such a high-k dielectric material, a gate insulating film with a physical film thickness of about 10 nm can be employed even when the gate length for use in an ultra high speed semiconductor device is very short, e.g., 0.1 µm or less, thereby preventing the gate leakage current resulting from the tunneling effect.

A $Ta_2O_5$ film is known to be formed through a CVD process from gaseous source materials of $Ta(OC_2H_5)_5$ and $O_2$. Typically, the CVD process is conducted in a depressurized environment and at about 480° C. or higher temperature. The $Ta_2O_5$ film formed in such manner is then subject to a heat treatment in the presence of oxygen for crystallization and this compensates for the oxygen deficiency in the film. The $Ta_2O_5$ film in its crystallized state possesses a large dielectric constant.

To enhance a carrier mobility in a channel region, it is preferable to interpose an extremely thin base oxide film having the thickness of 1 nm or less, preferably 0.8 nm or less, between a high-k dielectric gate oxide film and a silicon substrate. The base oxide film needs to be very thin since the merit of employing the high-k dielectric film as a gate insulating film might be lost otherwise. Such an extremely thin base oxide film is required to cover the surface of the silicon substrate uniformly, without forming defects such as interface states.

In FIG. 1, a sketchy diagram of a high speed semiconductor device 10 is presented.

Referring to FIG. 1, the semiconductor device 10 is formed on a silicon substrate 11. A high-k dielectric gate insulating film 13 such as $Ta_2O_5$, $Al_2O_3$, $ZrO_2$, $HfO_2$, $ZrSiO_4$ or $HfSiO_4$ is placed on a thin base oxide film 12 overlaying the silicon substrate 11. A gate electrode 14 is formed on the high-k dielectric gate insulating film 13.

In order to make the high-k dielectric film 13 function as it is supposed to on the base oxide film 12 in the semiconductor device 10, a heat treatment is needed as well as an oxygen deficiency compensation so that the high-k dielectric film in a deposited state is crystallized. Problem arises with such heat treatment on the high-k dielectric film 13 due to the increase in the film thickness of the base oxide film 12.

One of the reasons for the increase in the film thickness of the base oxide film following the heat treatment is thought to be due to the formation of a silicate layer resulting from a mutual diffusion between the silicon contained in the base oxide film 12 and a metal in the high-k dielectric film 13. Such an increase in the film thickness of the base oxide film 12 poses a very serious problem especially when the film thickness of the base oxide film 12 needs to be reduced to a level equivalent to several atomic layers or less, a preferred range of thickness for a base oxide film.

To suppress the increase in the thickness of the base oxide film, therefore, it has been proposed to nitride the surface of the base oxide layer to form an oxynitride film. FIG. 2 presents a sketchy structure of a semiconductor device 20 wherein the base oxide film surface is nitrided. In the drawing, the components identical to those in the semiconductor device 10 of FIG. 1 are indicated with the same reference numerals and explanations thereof will not be repeated.

In FIG. 2, on the surface of the base oxide film layer 12, nitrogen N is doped while maintaining the flatness of the interface between the silicon substrate 11 and the base oxide film 12 to form an oxynitride film 12A. This oxynitride film 12A can stop the formation of the silicate layer, and thereby prevent the increase in the thickness of the base oxide film 12.

However, the productivity can be adversely affected in this case due to the fact that the nitriding process has to be newly added to form the oxynitride film 12A. In addition, it is very difficult to control the nitrogen concentration in the thickness direction of the base oxide film layer 12. Furthermore, if the nitrogen concentration is enriched near the interface between the base oxide film 12 and the silicon substrate 11, formation of interface states may develop and problems such as carrier capturing and formation of leakage current path may arise.

SUMMARY OF THE INVENTION

It is, therefore, a primary object of the present invention to provide a novel and useful substrate processing technique of a semiconductor device devoid of the aforementioned problems.

Specifically, it is an object of the present invention to provide the substrate processing technique wherein an extremely thin oxynitride film, typically of a thickness equivalent to 1~3 atomic layers, is produced in a one step process on a silicon substrate surface.

It is another object of the present invention to provide the substrate processing technique wherein the nitrogen concentration can be appropriately controlled in the thickness direction in an extremely thin oxynitride film, typically of a thickness equivalent to 1~3 atomic layers, on a silicon substrate surface.

In accordance with a first aspect of the present invention, there is provided a method for forming an insulating film on a substrate. This method includes the steps of forming nitrogen radicals and oxygen radicals through a high frequency plasma and supplying the nitrogen radicals and the oxygen radicals to a surface of a substrate to be processed to form an insulating film thereon.

More specifically, the method for forming an insulating film on a substrate includes the steps of:

(a) forming a gas mixture by mixing a nitrogen gas or a nitrogen compound gas with an oxygen gas or an oxygen compound gas;

(b) exciting the gas mixture using a high frequency plasma to produce nitrogen radicals and oxygen radicals;

(c) supplying the nitrogen radicals and the oxygen radicals to a surface of a silicon containing substrate to be processed; and (d) creating an insulating film containing nitrogen on the surface of the substrate to be processed with the nitrogen radicals and the oxygen radicals.

The substrate to be processed may be, e.g., a silicon substrate and the insulating film containing nitrogen may be, e.g., an oxynitride film.

The gas mixture forming step includes the process in which the mixture ratio between the oxygen gas or the oxygen compound gas and the nitrogen gas or the nitrogen compound gas varies with time.

The nitrogen radicals and the oxygen radicals are carried by a stream of gas along the surface of the substrate to be processed to be supplied thereto.

It is preferable that the stream of gas flows from one side of the substrate to another side facing diametrically against said one side.

The high frequency plasma is produced by exciting the nitrogen gas and the oxygen gas at a frequency of 400 kHz-500 kHz.

In accordance with a second aspect of the present invention, there is provided a method for manufacturing a semiconductor device. The method for manufacturing the semiconductor device includes the steps of forming nitrogen radicals and oxygen radicals using a high frequency plasma, supplying the nitrogen radicals and the oxygen radicals to a surface of a semiconductor substrate for its surface processing and forming an active device on the surface-processed semiconductor substrate.

More specifically, the method for manufacturing the semiconductor device includes the steps of:

(a) forming a gas mixture by mixing a nitrogen gas or a nitrogen compound gas with an oxygen gas or an oxygen compound gas;

(b) exciting the gas mixture using a high frequency plasma to produce nitrogen radicals and oxygen radicals;

(c) supplying the nitrogen radicals and the oxygen radicals to a surface of a silicon containing substrate to be processed;

(d) creating an insulating film containing nitrogen on the surface of the substrate with the nitrogen radicals and the oxygen radicals; and (e) forming the semiconductor device on the substrate which has the insulating film.

In accordance with a third aspect of the present invention, there is provided an apparatus for processing a substrate in accordance with the aforementioned substrate processing technique. The apparatus for processing the substrate includes a radical forming unit for producing nitrogen radicals and oxygen radicals using a high frequency plasma and a processing vessel for holding a substrate to be processed, wherein the radical forming unit houses a supply port for feeding the nitrogen and oxygen radicals generated therefrom into the processing vessel. The nitrogen radicals and the oxygen radicals are supplied to the surface of the substrate held in the processing vessel to form the insulating film thereon.

The apparatus for processing the substrate further includes a gas inlet port for feeding a gas mixture into the radical forming unit, wherein the gas inlet port controls the gas mixture to have a desired mixture ratio between a first source material gas containing nitrogen and a second source material gas containing oxygen. The ratio between the nitrogen radicals and the oxygen radicals, formed in the radical forming unit to be fed into the processing vessel, can be manipulated through an adjustment of the mixture ratio between the first source material gas and the second source material gas.

The radical forming unit, placed at a side of the processing vessel, generates a stream of gas flowing along the surface of the substrate, wherein the nitrogen radicals and the oxygen radicals are supplied onto the surface of the substrate by being carried along the surface of the substrate by the stream of gas.

The processing vessel has a gas exhaust port for exhausting nitrogen radicals and oxygen radicals. The gas exhaust port is facing the supply port in the radical forming unit. By such placing, a stream of gas flows from the radical forming unit to an opposite side along the surface of the substrate.

The radical forming unit further includes frequency application means for exciting the gas mixture with a frequency of 400 kHz-500 kHz.

In accordance with the method for forming the insulating film, the method for manufacturing the semiconductor device and the apparatus for processing the substrate based on the aforementioned substrate processing technique, the nitrogen radicals and the oxygen radicals excited through the high frequency plasma can form an extremely thin oxynitride film in a one step process. Accordingly, the productivity is improved through a reduction in the number of steps required over the prior art technique wherein the nitriding of the oxide film is additionally needed to form the oxynitride film.

Further, the amount of the oxygen radicals added to the nitrogen radicals can be controlled during the formation of the oxynitride film. Accordingly, the nitrogen concentration can be controlled in the thickness direction of the oxynitride film at a desired profile.

Furthermore, since the dielectric constant of an oxynitride film is greater than that of the silicon oxide film previously used in the art, the thickness of, the part corresponding to the thermal oxide film can be reduced.

BRIEF DESCRIPTION OF THE DRAWINGS

The above and other objects and features of the present invention will become apparent from the following description of preferred embodiments given in conjunction with the accompanying drawings, in which:

FIG. 7 sets forth a comparison of the properties between a microwave excited plasma and a high frequency wave plasma;

FIG. 8 exhibits a flow of radicals for forming the oxynitride film using the apparatus of FIG. 3, a side view thereof being shown in 8A and a top view shown in 8B;

FIGS. 9A and 9B represent modifications to the apparatus for processing the substrate of FIGS. 8A and 8B, respectively;

FIG. 15 outlines a fifth exemplary control mechanism of the mixture ratio between nitrogen and oxygen.

DETAILED DESCRIPTION OF THE PREFERRED EMBODIMENTS

The preferred embodiment of the present invention will now be explained with reference to the drawings.

Figure 1:
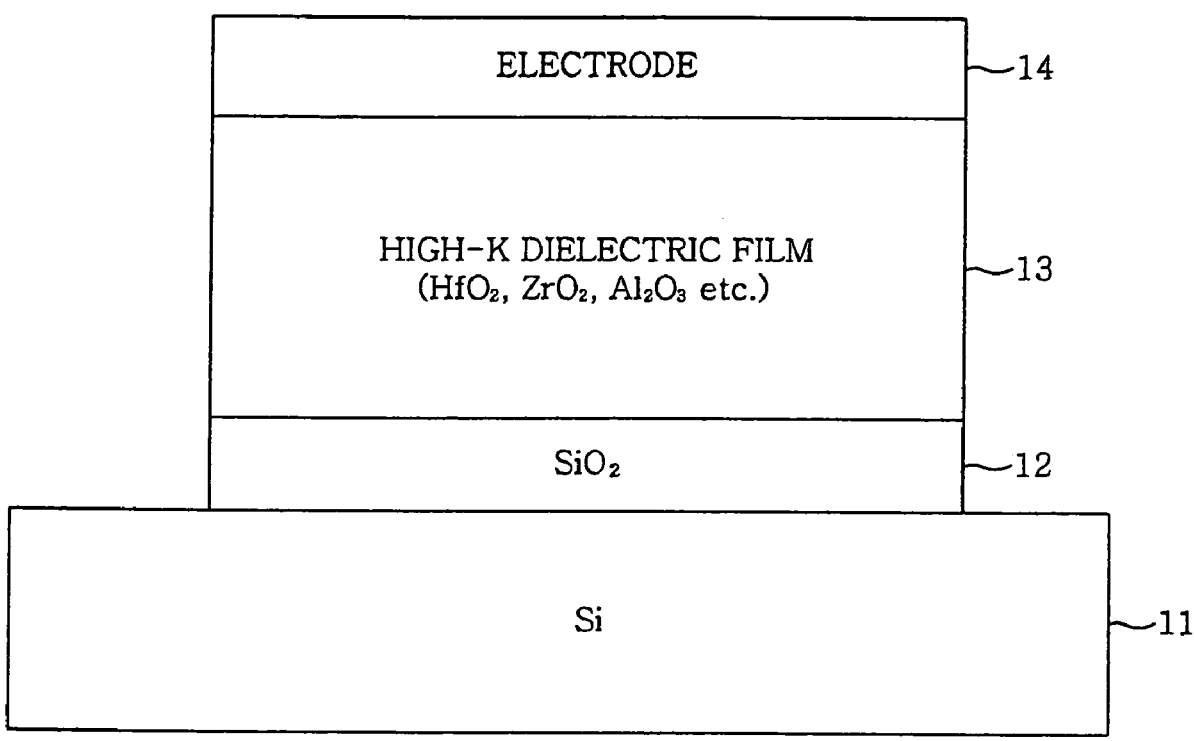
FIG. 1 exemplifies a structure of a semiconductor device including a high-k dielectric gate insulating film and a base oxide film.
Figure 2:
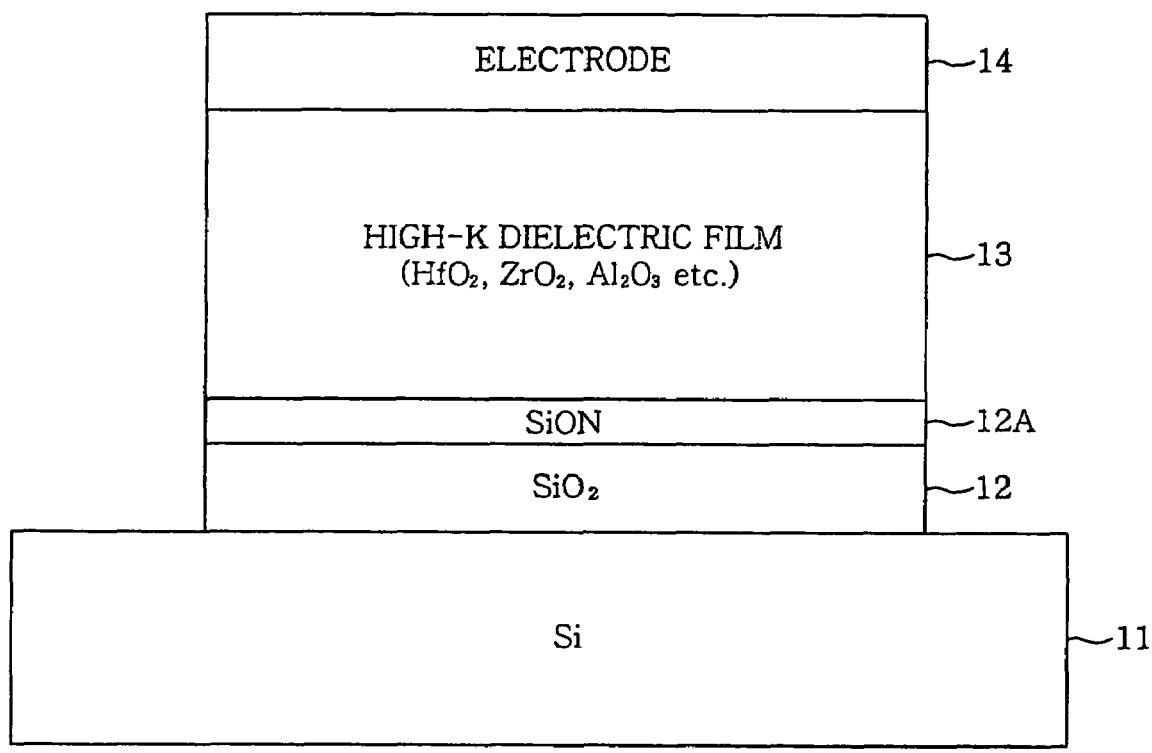
FIG. 2 shows a structure of a semiconductor device having an oxynitride film disposed between a high-k dielectric gate insulating film and a base oxide film.
Figure 3:
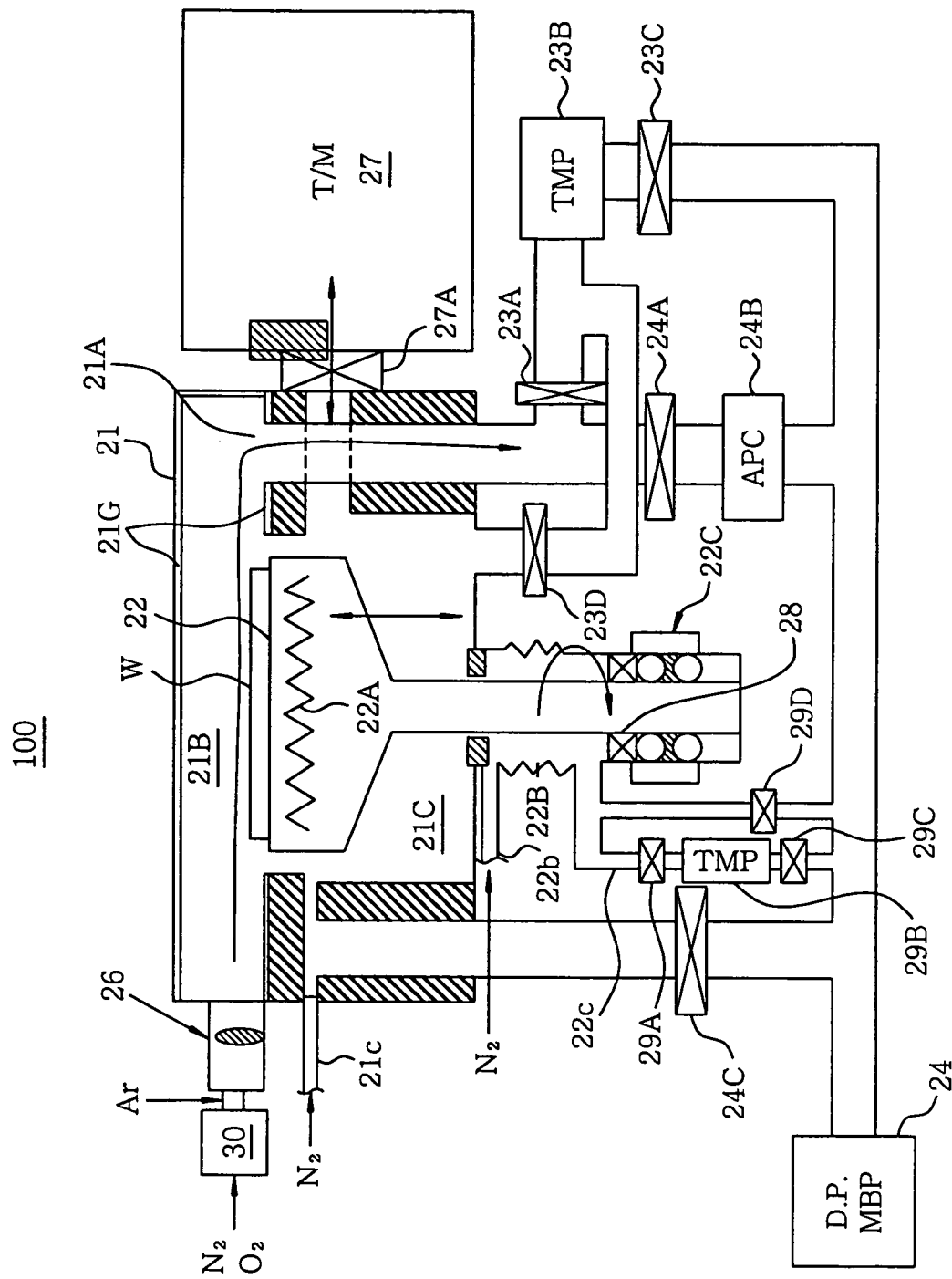
FIG. 3 illustrates a structure of an apparatus for processing a substrate in accordance with the embodiment of the present invention.

FIG. 3 shows a sketchy diagram of an apparatus 100 for processing a substrate in accordance with the preferred embodiment of the present invention. Through the use of such apparatus 100, an oxynitride film is formed on the silicon wafer 11 as shown in FIG. 2.

The apparatus 100 for processing the substrate includes a processing vessel 21, a remote plasma source 26 for producing nitrogen radicals and oxygen radicals using a high frequency plasma and a gas supply unit 30 for feeding a raw gas into the remote plasma source 26.

The processing vessel 21 accommodates a substrate supporting table 22 with a heater 22A attached thereto. The substrate supporting table 22 moves between a wafer loading/unloading position and a process position in a vertical way. A drive mechanism 22C rotates the substrate supporting table 22. The inner wall of the processing vessel 21 is coated with a liner 21G made of quartz glass to suppress the metallic contamination that may otherwise occur so that the level of contamination of the substrate W to be processed is kept at a level of $1 \times 10^{10}$ atoms/cm$^2$ or below.

A magnetic seal 28 is disposed at an adjoining part of the substrate supporting table 22 and the drive mechanism 22C. The magnetic seal 28 separates a magnetic sealing room 22B maintained at a vacuum state from the drive mechanism 22C operating in an atmospheric environment. Since the magnetic seal 28 is in a liquid state, the substrate supporting table 22 can rotate freely.

In FIG. 3, the substrate supporting table 22 is placed at the process position while a loading/unloading room 21C for loading/unloading the substrate W to be processed is left beneath it. The processing vessel 21 is connected to a substrate transferring unit 27 via a gate valve 27A. When the substrate supporting table 22 is lowered to a loading/unloading position of the loading/unloading room 21C, the substrate W is transferred to the substrate supporting table 22 from the substrate transferring unit 27 through the gate valve 27A. Likewise, the processed substrate W is transferred from the substrate supporting table 22 to the substrate transferring unit 27.

In the apparatus 100 of FIG. 3, a gas exhaust port 21A is formed near the gate valve 27A of the processing vessel 21. A turbo molecular pump 23B is connected to the gas exhaust port 21A via a valve 23A. A pump 24, comprised of a dry pump and a mechanical booster pump, is connected to the turbo molecular pump 23B via a valve 23C. By driving the turbo molecular pump 23B and the dry pump, the pressure inside the processing space 21B can be lowered to $1.33 \times 10^{-1} \sim 1.33 \times 10^{-4}$ Pa ($10^{-3} \sim 10^{-6}$ Torr).

In addition, the gas exhaust port 21A is directly connected to the pump 24 via the valve 24A and an APC 24B. By opening the valve 24A, the processing space is depressurized to 1.33 Pa~13.3 kPa (0.01~100 Torr).

A remote plasma source 26 is placed at an opposite side of the gas exhaust port 21A in the processing vessel 21. The gas supply unit 30 for feeding nitrogen and oxygen is connected to the remote plasma source 26. In the gas supply unit 30, a very small amount of oxygen is added to the nitrogen being fed into so that a gas mixture of certain ratio can be produced. The oxygen concentration may be in the range of about 10 ppm~600 ppm. The method for controlling the mixture ratio will be shown later when describing FIGS. 9 to 13. The produced nitrogen/oxygen gas mixture is fed into the remote plasma source 26 along with an inert gas such as argon (Ar). By activating the nitrogen/oxygen gas mixture into a plasma, the nitrogen radicals and the oxygen radicals of certain mixture ratio can be produced. In other words, by adjusting the mixture ratio between nitrogen and oxygen fed into the remote plasma source 26, the ratio between the nitrogen radicals and the oxygen radicals produced at the remote plasma source 26 can be manipulated. Accordingly, the oxynitride film having a desired nitrogen concentration can be formed on the substrate W.

A purge line 21c for nitrogen-purging the loading/unloading room 21C, a purge line 22b for nitrogen-purging the magnetic sealing room 22B and an exhaust line 22c thereof are provided in the apparatus 100 of FIG. 3. To be more specific, the exhaust line 22c is connected to a turbo molecular pump 29B via a valve 29A and the turbo molecular pump 29B is connected to the pump 24 via another valve 29D. There is also a direct connection between the exhaust line 22c and the pump 24 via the valve 29D, so that the pressure inside the magnetic sealing room 22B can be controlled freely.

The loading/unloading room 21C is exhausted by the pump 24 through the valve 29C. Or it can be exhausted by the turbo molecular pump 23B through the valve 23D. To prevent the contamination of the processing space 21B, the loading/unloading room 21C is kept at a lower pressure than the processing space 21B. The magnetic sealing room 22B is kept at a lower pressure than the loading/unloading room 21C by a differential pumping.

Figure 4:
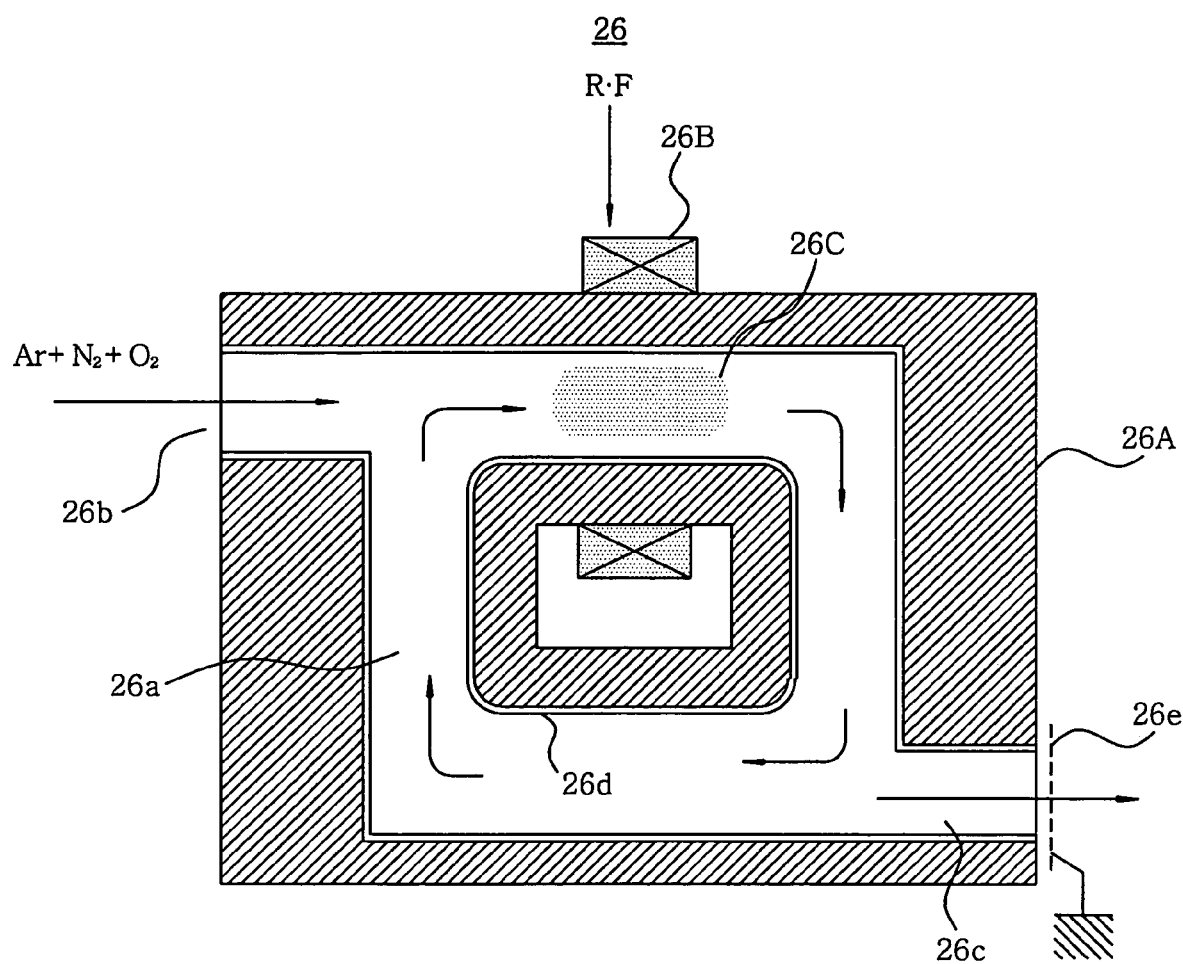
FIG. 4 depicts a structure of a remote plasma source for use in the apparatus of FIG. 3.

In FIG. 4, the structure of the remote plasma source 26 for use in the apparatus 100 of FIG. 3 is shown. The remote plasma source 26 typically includes a block 26A made of aluminum and a ferrite core 26B built on the part of the block 26A. A gas circulation passage 26a, a gas inlet 26b and a gas outlet 26c are provided inside the block 26A in communication therewith.

Fluorine resin coating is done on the inner surface of the gas circulation passage 26a, the gas inlet 26b and the gas outlet 26c. By applying a high frequency wave of 400 kHz-500 kHz to the coil wound around the ferrite core 26B, a plasma 26C is formed inside the gas circulation passage 26a.

Upon the excitation of the plasma 26C, nitrogen radicals, oxygen radicals, nitrogen ions and oxygen ions are formed inside the gas circulation passage 26a. The nitrogen ions and the oxygen ions disappear as they circulate through the gas circulation passage 26a while the gas outlet 26c releases mostly the nitrogen radicals $N_2^*$ and the oxygen radicals $O_2^*$. Further, a grounded ion filter 26e is provided at the gas outlet 26c, as shown in FIG. 4. By such structure, charged particles such as the nitrogen ions can be removed and the nitrogen radicals and the oxygen radicals can be exclusively provided to the processing space 21B. Even when the ion filter 26e is not grounded, the ion filter 26e may function as a diffusion plate to substantially remove the charged particles such as the nitrogen ions.

Figure 5:
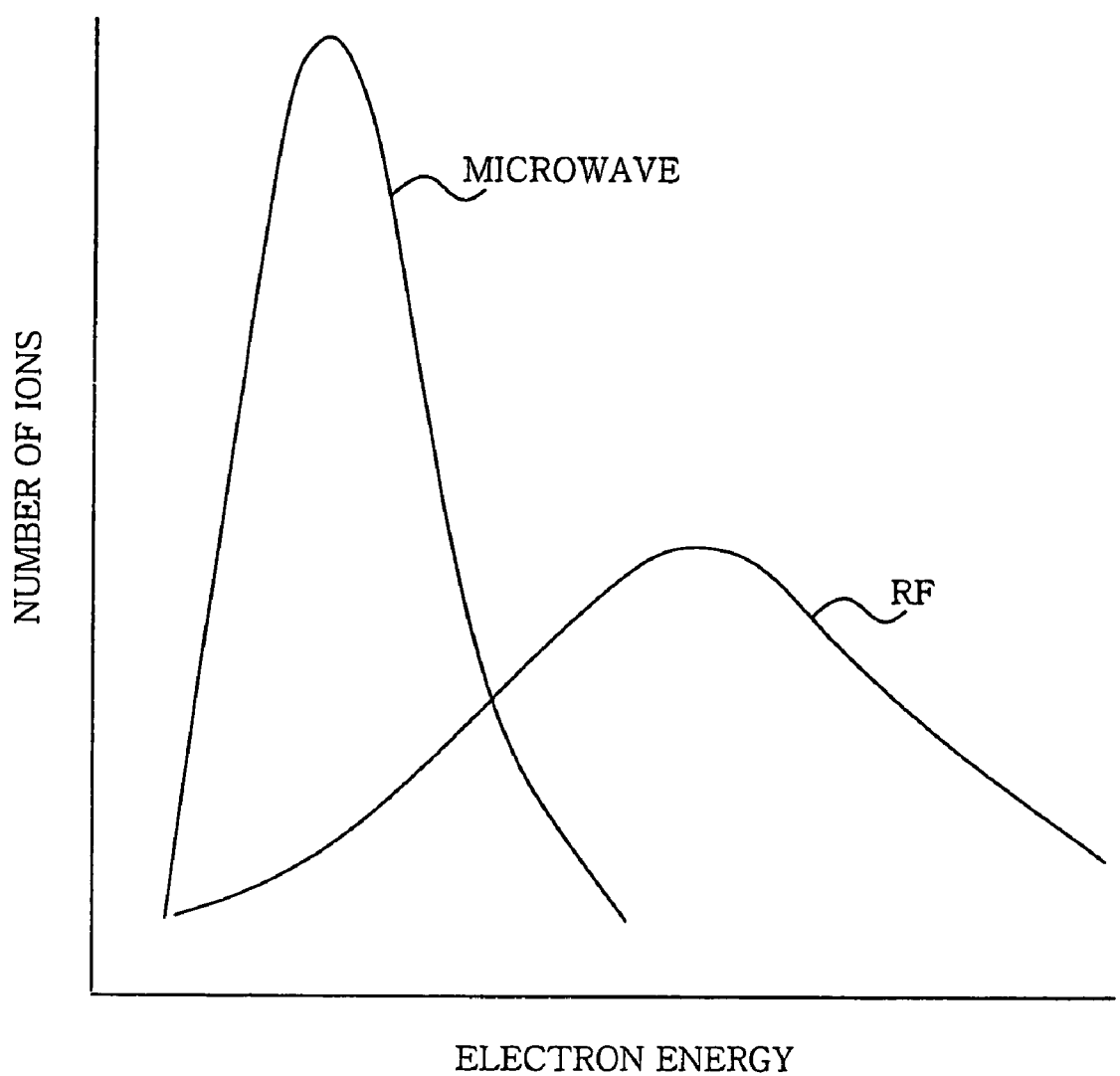
FIG. 5 accords a comparison of the properties between a microwave plasma and a RF remote plasma produced by the remote plasma source of FIG. 4.
Figure 6:
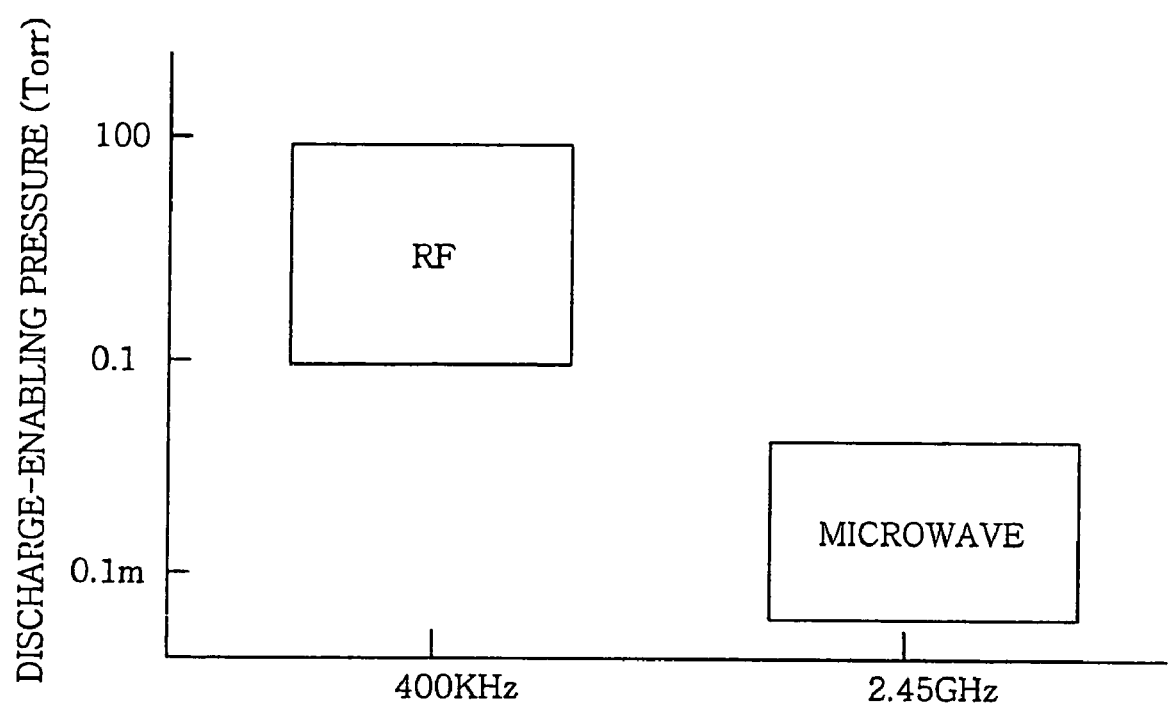
FIG. 6 describes a comparison of the discharging properties between RF remote plasma and a microwave plasma.

FIG. 5 shows a relationship between the number of ions produced by the remote plasma source 26 of FIG. 4 and the electron energy in comparison with that when microwave plasma source is employed. When a microwave is used to generate a plasma, ionization of nitrogen molecules and oxygen molecules is accelerated, thereby forming a plenty of nitrogen ions and oxygen ions. On the other hand, when a high frequency wave of 500 kHz or less is used, formation of nitrogen ions and oxygen ions is greatly reduced. When executing a plasma excitation with a microwave, a high vacuum level (low pressure) of $1.33 \times 10^{-1}$~$1.33 \times 10^{-4}$ Pa ($10^{-3}$~$10^{-6}$ Torr) is required as shown in FIG. 6; whereas a relatively high pressure of 1.33 Pa~13.3 kPa (0.01~100 Torr) suffices in case of a high frequency plasma excitation.

FIG. 7 presents differences in the energy efficiency for ionization, the range of discharge enabling pressure, the plasma power consumption and the process gas flow rate between a microwave and a high frequency wave when they are used to generate a plasma. The energy efficiency for ionization is about $1 \times 10^{-2}$ in case of microwave excitation while that number is reduced to about $1 \times 10^{-7}$ in case of RF excitation. The discharge enabling pressure is about 1 mTorr~0.1 Torr (133 mPa~13.3 Pa) in case of microwave excitation while it is about 0.1~100 Torr (13.3 Pa~13.3 kPa) when excited with RF. Further, it is shown that plasma power consumption is greater in case of RF excitation than microwave excitation. The process gas flow rate is much larger in case of the RF excitation than the microwave excitation.

In the apparatus 100 for processing the substrate as shown in FIG. 3, an oxynitride film is produced by the nitrogen radicals and the oxygen radicals. The nitrogen ions and the oxygen ions do not contribute to the formation of an oxynitride film. Accordingly, it is preferable that the amount of the nitrogen ions and the oxygen ions be kept small. Further, in order to minimize damages that might be incurred on the substrate to be processed, the number of the nitrogen ions and the oxygen ions is preferred to be small. In addition, since the number of the nitrogen radicals and the oxygen radicals excited being small, the apparatus 100 for processing the substrate of FIG. 3 is ideal in forming an extremely thin oxynitride film under a high-k dielectric insulating film.

FIG. 8 presents a flow of radicals when forming the oxynitride film in the apparatus 100 for processing the substrate of FIG. 3, a side view thereof being shown in 8A and a top view in 8B. In the drawing, the components identical to those previously explained are indicated with the same reference numerals and explanations thereof will not be repeated.

The oxynitride film is formed on the substrate W as follows. First, argon (Ar) gas is fed into the remote plasma radical source 26 along with the nitrogen gas and the oxygen gas that are transferred from the gas supply unit 30, the mixture ratio between the nitrogen gas and the oxygen gas being adjusted to a desired level. Through a high frequency plasma excitation with a high frequency wave of several hundreds of kHz, the nitrogen radicals and the oxygen radicals in a desired mixture ratio are formed. The nitrogen radicals and the oxygen radicals so produced flow along the surface of the substrate W before being discharged through the gas exhaust port 21A and the pump 24. Consequently, the processing space 21B is set at 6.65 Pa~1.33 kPa (0.05~10 Torr), an appropriate pressure for oxynitriding the substrate W. When the nitrogen radicals and the oxygen radicals flow along the surface of the substrate W, an extremely thin oxynitride film, typically of a thickness equivalent to 1~3 atomic layers, is formed on the surface of the rotating substrate W.

In forming the oxynitride film as shown in FIGS. 8A and 8B, it is possible to conduct a purge process prior to the formation of an oxynitride film as described below. When purging, valves 23A, 23C are opened and the valve 24A is closed to depressurize the processing space 21B to $1.33 \times 10^{-1}$~$1.33 \times 10^{-4}$ Pa. In the subsequent oxynitride film forming process, the valves 23A, 23C are closed. The turbo molecular pump 23B is not included in the exhaustion line of the processing space 21B.

Through the aforementioned purge process, it is possible to purge the oxygen and moisture remaining in the processing space 21B.

As shown in top view of FIG. 8 (B), a turbo molecular pump 23B is disposed to protrude from a side of the processing vessel 21 away from the substrate transferring unit 27.

FIGS. 9A and 9B provide a modification 40 to the apparatus for processing the substrate of FIG. 8A and FIG. 8B, a side view thereof being shown in FIG. 9A and a top view shown in FIG. 9B. In the modification 40 of the apparatus for processing the substrate, the turbo molecular pump 23B is placed in a different way. In the drawing, the components identical to those previously explained are indicated with the same reference numerals and explanations thereof will not be repeated.

As shown in FIG. 9A and FIG. 9B, a turbo molecular pump 23B is disposed at an opposite side of the substrate transferring unit 27 and is outside of the processing vessel 21. Further, the gas exhaust port 21E working with the turbo molecular pump 23B is formed at an opposite side of the substrate transferring unit 27.

The turbo molecular pump 23B is connected to the bottom of the processing vessel 21 vertically via the valve 23A such that an intaking port is placed up and an exhausting port is placed down. The gas exhaust port of the turbo molecular pump 23B is connected to a downstream side of the valve 24A in the exhaust line which starts from the gas exhaust port 21A of the processing vessel 21, goes through the valve 24A and ends at the pump 24.

As the turbo molecular pump 23B of the apparatus 40 for processing the substrate is placed below the processing vessel 21, the occupying space of the apparatus for processing the substrate can be reduced in comparison with the structure of the apparatus 100 for processing the substrate shown in FIGS. 8A and 8B.

The process of forming the oxynitride film on the substrate W with a modification 40 shown in FIGS. 9A and 9B will now be described.

First, argon (Ar) gas is fed into the remote plasma radical source 26 along with the nitrogen gas and the oxygen gas that are transferred from the gas supply unit 30, the mixture ratio thereof being adjusted to a desired level. Through a high frequency plasma excitation with a high frequency wave of several hundreds of kHz, nitrogen radicals and oxygen radicals of a certain mixture ratio are formed. Such nitrogen radicals and oxygen radicals flow along the surface of the substrate W before being discharged through the gas exhaust port 21A and the pump 24. And the processing space 21B is set at 6.65 Pa~1.33 kPa (0.05~10 Torr), an appropriate pressure for oxynitriding the substrate W. When the nitrogen radicals and the oxygen radicals flow along the surface of the substrate W, an extremely thin oxynitride film, typically of a thickness equivalent to 1~3 atomic layers, is formed on the surface of the rotating substrate W.

In forming the oxynitride film as shown in FIGS. 9A and 9B, it is possible to conduct the purge process as described above prior to the formation of the oxynitride film. In other words, the valve 23A and 23C are opened and the valve 24A is closed to depressurize the processing space 21B to $1.33 \times 10^{-1} \sim 1.33 \times 10^{-4}$ Pa. In the subsequent oxynitride film forming process, the valve 23A and 23C are closed. The turbo molecular pump 23B is not included in the exhaustion line of the processing space 21B. By employing such purge process, it is possible to purge the oxygen and moisture remaining in the processing space 21B.

Figure 10:
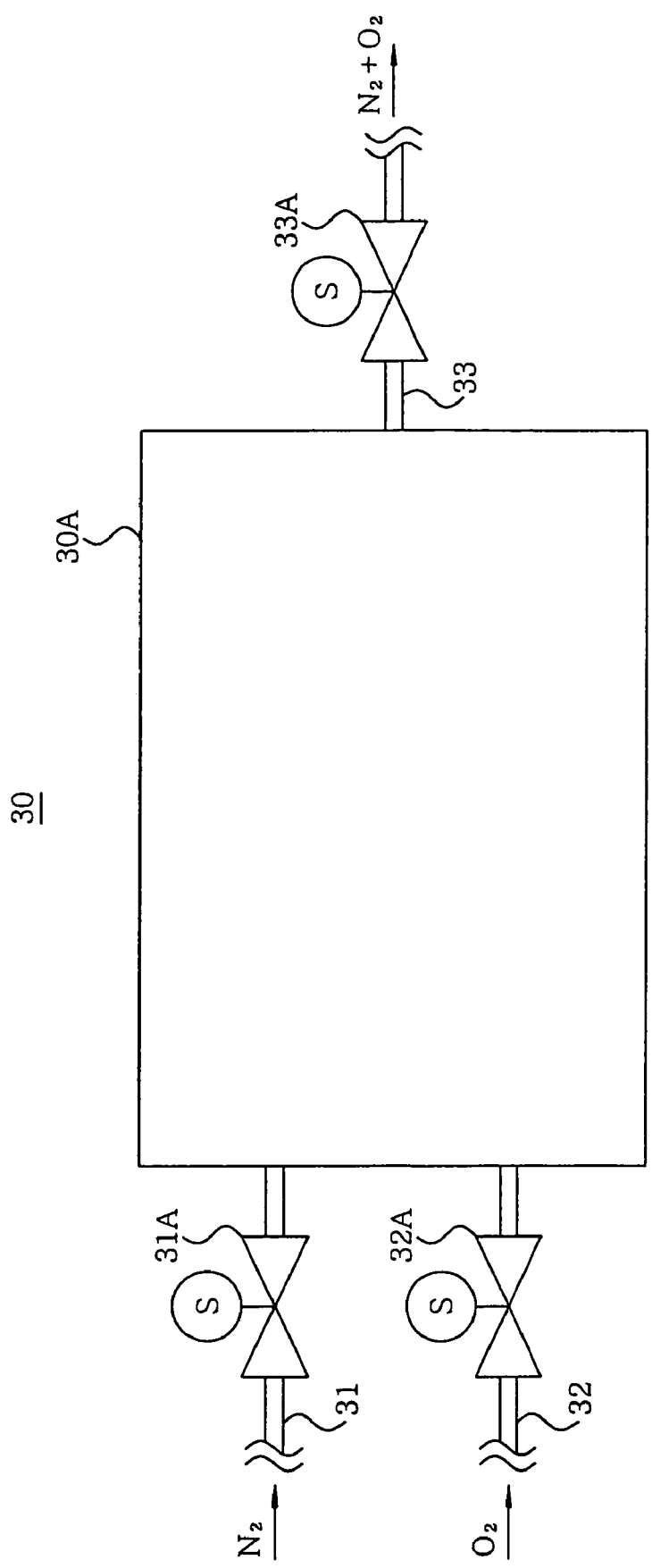
FIG. 10 demonstrates a structure of a gas supply system for use in the apparatus for processing a substrate.

In FIG. 10, the structure of the gas supply system 30 for feeding the nitrogen gas and the oxygen gas to the remote plasma source 26 is shown. The gas supply system 30 includes a nitrogen introducing line 31 having a nitrogen introducing valve 31A; an oxygen introducing line 32 having an oxygen introducing valve 32A; and a gas mixture supply line 33 having a mixing tank 30A and a gas mixture supply valve 33A. By opening the nitrogen introducing valve 31A, nitrogen is introduced into the mixing tank 30A from the nitrogen introducing line 31. For the oxygen mixing in the mixing tank 30A, a very small amount of oxygen is introduced into the mixing tank from the oxygen introducing line 32 by opening the oxygen introducing valve 32A for a short period of time. The concentration of oxygen is controlled by adjusting the opening interval of the oxygen introducing valve 32A. The nitrogen and oxygen mixed in the mixing tank 30A are fed into the remote plasma source 26 from the gas mixture supply line 33 by opening the gas mixture supply valve 33A.

By adjusting the relative concentration of oxygen to nitrogen in the gas mixture fed into the remote plasma source 26, the ratio between the nitrogen radicals and the oxygen radicals produced can be controlled. Accordingly, an extremely thin oxynitride film can be formed in the processing vessel 21 at a desired nitrogen concentration, typically of a thickness equivalent to 1~3 atomic layers.

As shown above, the oxynitride film can be produced in a one step continuous process, thereby entailing a reduction in the number of processing steps for producing the oxynitride film when compared with the case in which the surface is nitrided and the oxynitride film is formed after the oxide film is formed. Accordingly, the productivity can be improved.

Next, an explanation on how to control the nitrogen concentration in the oxynitride film will be given in detail.

Figure 11:
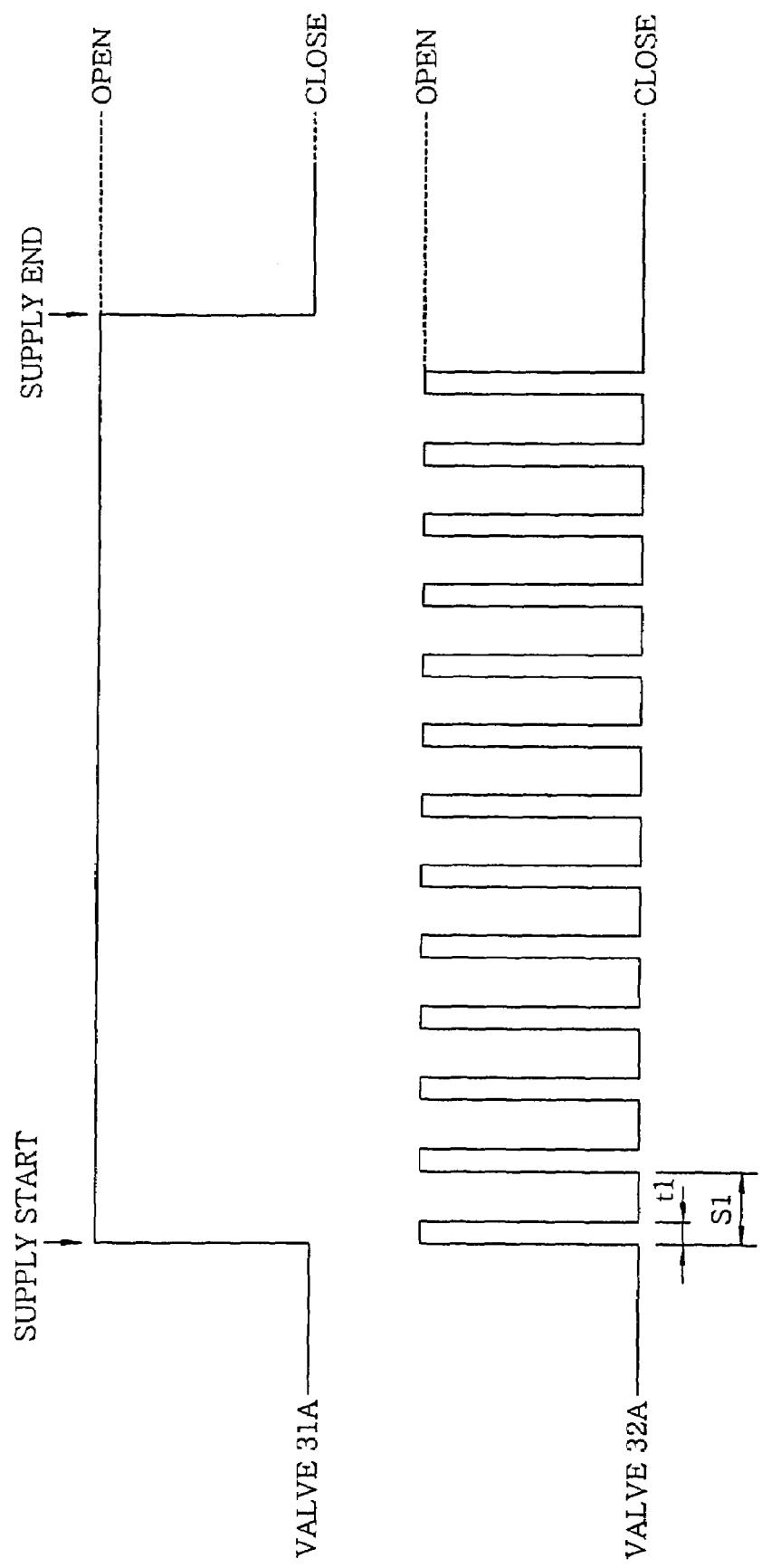
FIG. 11 offers a first exemplary control mechanism of the mixture ratio between nitrogen and oxygen in accordance with the embodiment of the present invention.

FIG. 11 presents a first exemplary timing chart showing opening/closing timing of the nitrogen introducing valve 31A and the oxygen introducing valve 32A wherein x-axis represents time. The nitrogen introducing valve 31A is in an open state while the gas mixture of nitrogen and oxygen is supplied. The oxygen introducing valve 32A is open for a short period of time before it is closed and, after a while, it is open again for a short period of time and closed, repeating the same pattern of switching movements to achieve a desired oxygen concentration. If the length of time for which the oxygen introducing valve 32A is open is put as t1 and the interval between the openings of the oxygen introducing valve 32A is put as S1, the concentration of oxygen mixed with nitrogen can be adjusted by controlling t1 and S1. Accordingly, the ratio between the nitrogen radicals and the oxygen radicals produced from the remote plasma source 26 is controlled such that the nitrogen concentration in the oxynitride film formed on the substrate W can be adjusted to a desired value.

In this case, as the oxidation reaction is faster than the nitriding reaction, the nitrogen concentration in the oxynitride film can be controlled at about 10~40% when the oxygen concentration added to nitrogen is about 10 ppm~600 ppm.

The process conditions for forming the oxynitride film having about e.g., 10~40% nitrogen concentration may be as follows: the pressure in the processing vessel 21 of 6.65 Pa~1.33 kPa (0.05~10 Torr); Ar gas flow rate of 0.7~2 slm; the nitrogen flow rate of 0.05~0.9 slm; the oxygen flow rate of 0~0.1 slm; the oxygen concentration of 10~300 ppm in the gas mixture of nitrogen and oxygen; and the temperature of 400~700° C. at the substrate W.

Figure 12:
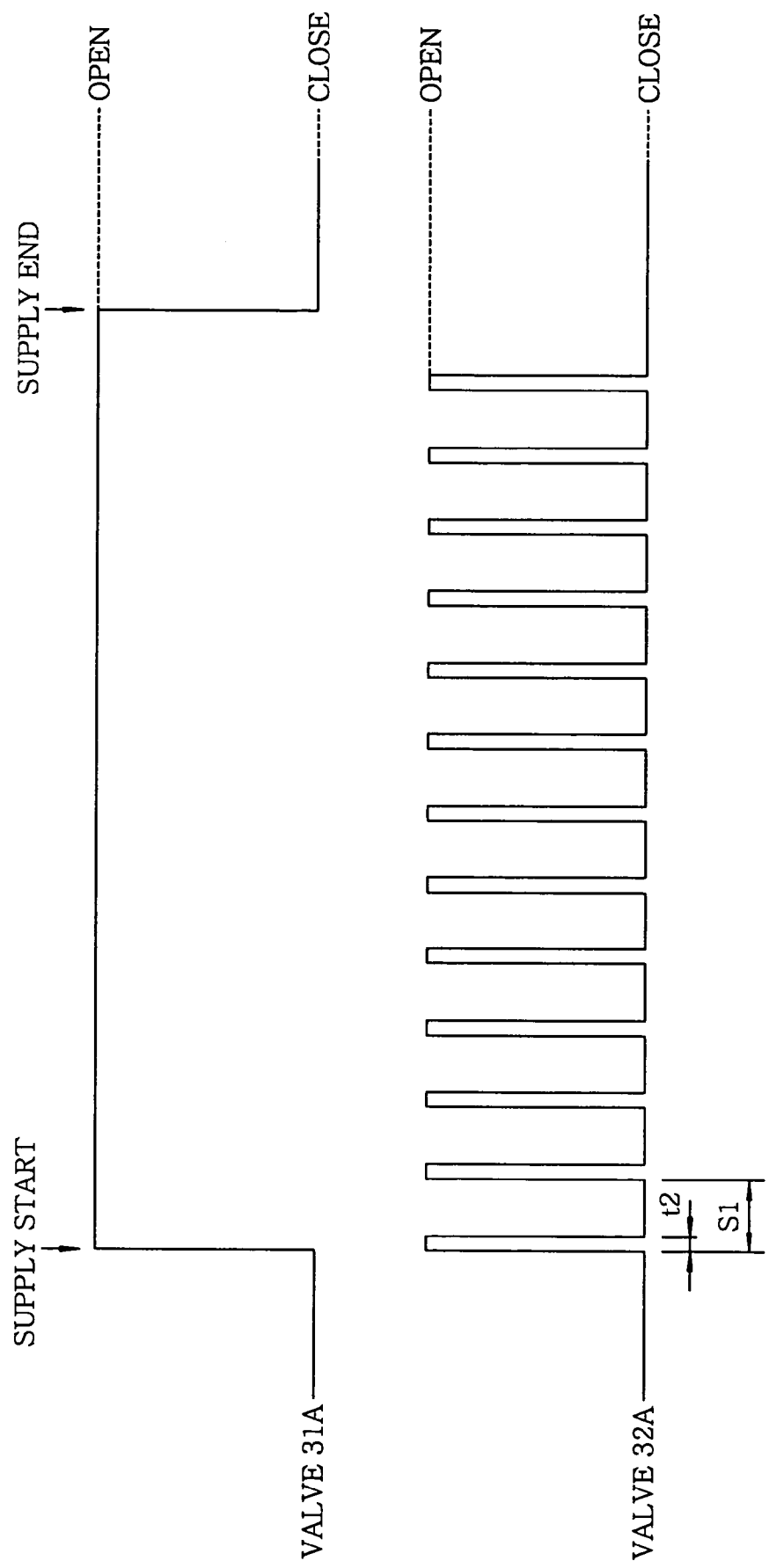
FIG. 12 presents a second exemplary control mechanism of the mixture ratio between nitrogen and oxygen.

FIG. 12 shows a second exemplary control of the mixture ratio between nitrogen and oxygen. FIG. 12 also shows the state with respect to time of the nitrogen introducing valve 31A and the oxygen introducing valve 32A wherein x-axis represents progress of time.

When compared with the first example depicted in FIG. 11, S1 value (the interval between the openings of the oxygen introducing valve 32A) remains the same; however, t2, the length of time for which the oxygen introducing valve 32A is open, is shorter than t1 of the first example. Accordingly, the amount of the oxygen mixed is reduced and the amount of the oxygen radicals formed from the remote plasma source 26 decreases and the oxidation reaction is suppressed during the formation of the oxynitride film on the substrate W. In other words, in the process of forming the oxynitride film, the nitriding reaction is further progressed than the first example so that the nitrogen concentration in the produced oxynitride film is enhanced.

Figure 13:
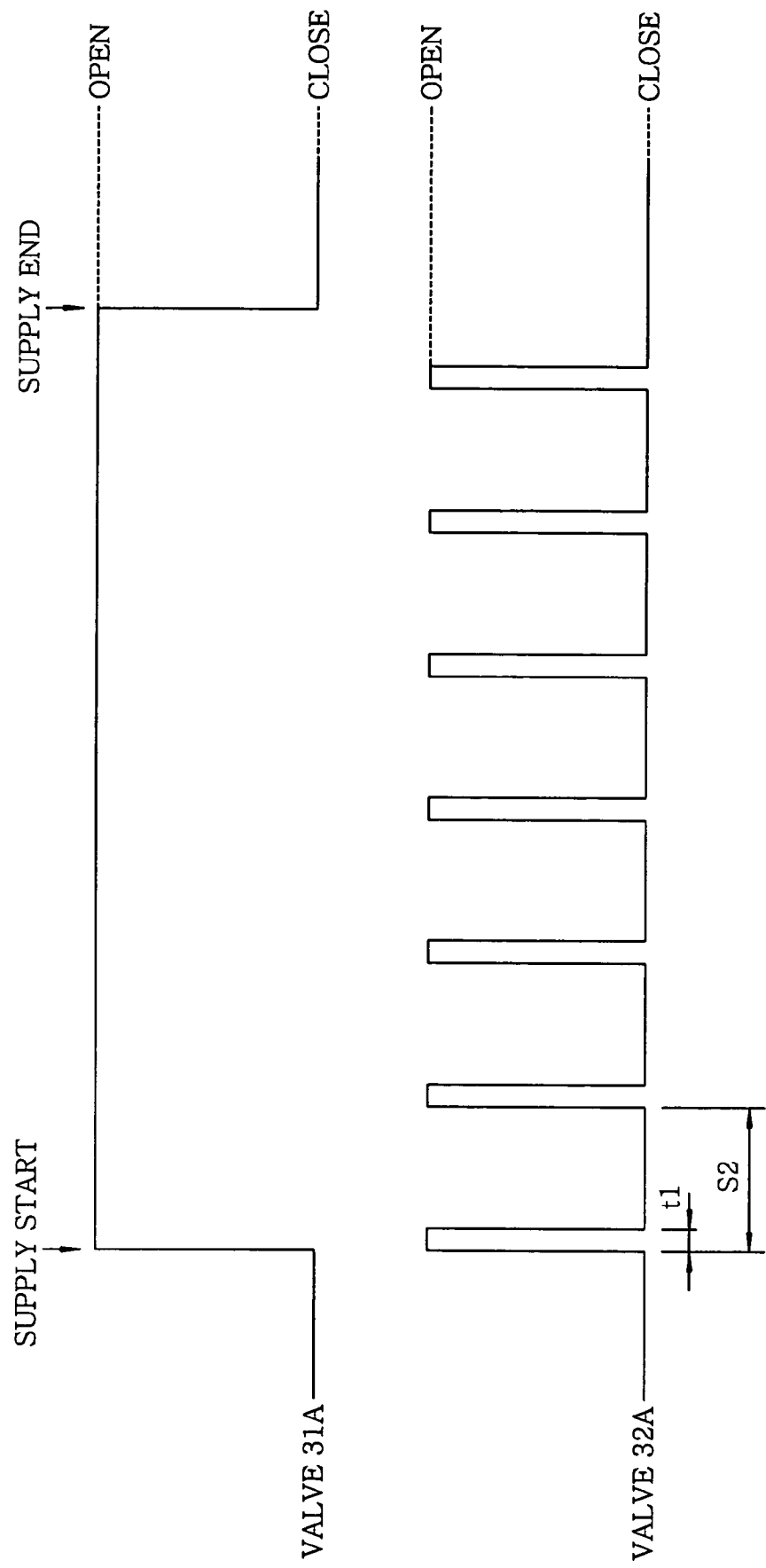
FIG. 13 provides a third exemplary control mechanism of the mixture ratio between nitrogen and oxygen.

Next, FIG. 13 shows a third exemplary control of the mixture ratio between nitrogen and oxygen showing the timing of the nitrogen introducing valve 31A and the oxygen introducing valve 32A wherein x-axis represents time. In comparing with the first example shown in FIG. 11, the length of time for which the oxygen introducing valve 32A is open in the third example shown in FIG. 13 is identical to that in the first example, i.e., t1; however, S2, the interval between the openings of the oxygen introducing valve 32A is set to be longer than S1 of the first example. Accordingly, the amount of the oxygen mixed is reduced. As a result, the amount of the oxygen radicals formed from the remote plasma source 26 decreases and the oxidation reaction is suppressed during the formation of the oxynitride film on the substrate W. In other words, the nitriding reaction is further carried out than the first example so that the nitrogen concentration in the oxynitride film can be enhanced.

Figure 14:
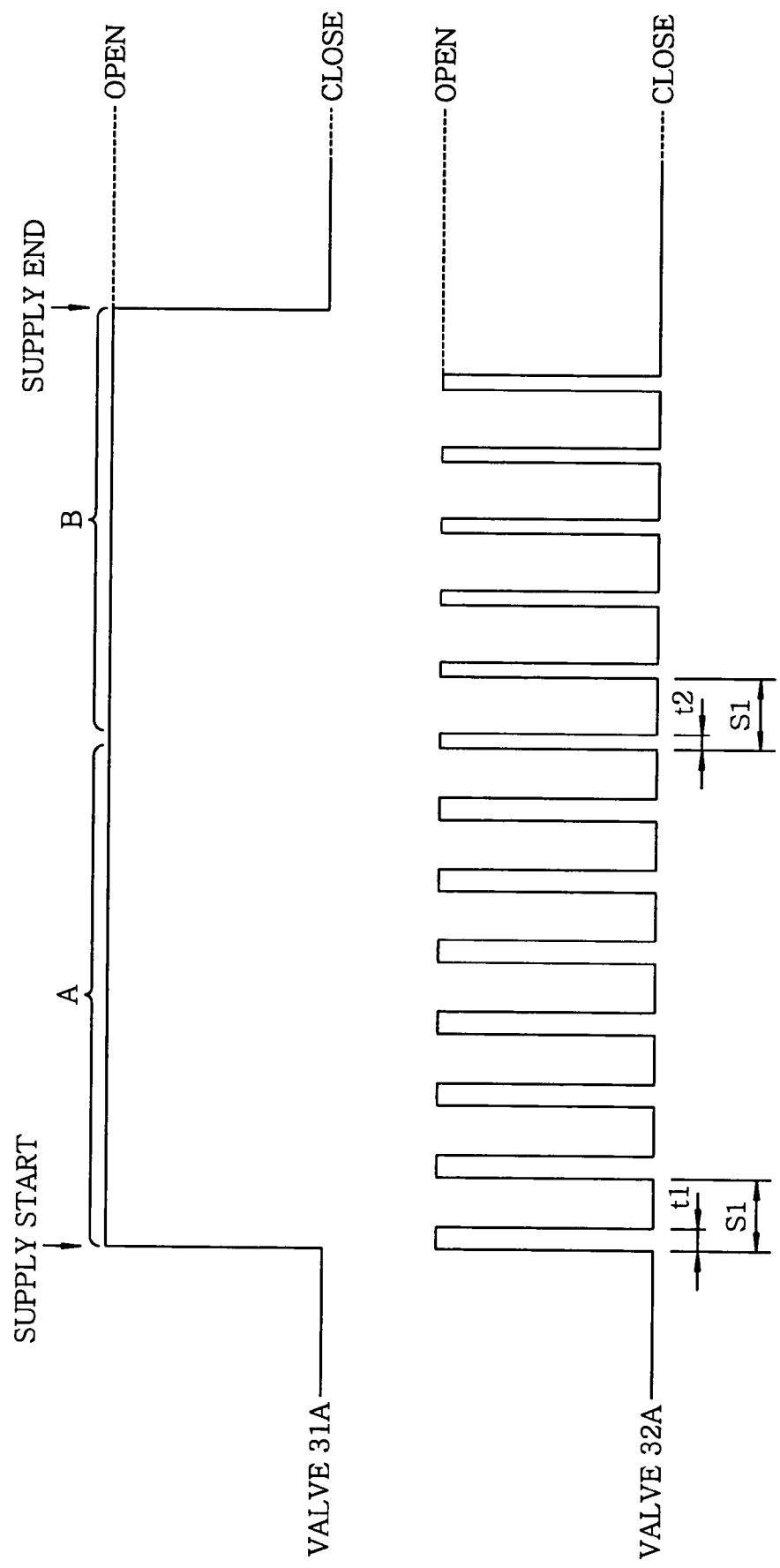
FIG. 14 discloses a fourth exemplary control mechanism of the mixture ratio between nitrogen and oxygen.

Next, FIG. 14 shows a fourth exemplary control of the mixture ratio between nitrogen and oxygen showing the timing of the nitrogen introducing valve 31A and the oxygen introducing valve 32A wherein x-axis represents time. The fourth example shown in FIG. 14 is a combination of the first example in FIG. 11 and the second example in FIG. 12.

During the continuous period A, which represents the first half of the oxynitriding process right after the start of the feeding, the length of time for which the oxygen valve is open and the interval between the openings of the oxygen valve are, respectively, set to be t1 and S1 as in the first example. During period B, the second half of the oxynitriding process, the interval between the openings of the oxygen valve is maintained at S1 while the length of time for which the oxygen valve is open is adjusted from t1 to t2 (t1>t2). By shortening the length of time for which the oxygen introducing valve 32A is open, the amount of the oxygen mixed is reduced. Accordingly, the nitriding reaction is furthered during the second half in comparison with the first half period of the oxynitride film forming process, thereby enabling a structure wherein the nitrogen concentration is increased in the thickness direction of the oxynitride film.

In the actual semiconductor device, when the device characteristics are taken into account, the nitrogen concentration may be preferably lower near the silicon (Si) substrate, i.e., during the first half of the oxynitriding process, to form a smooth interface between the silicon substrate and the oxynitride film. On the other hand, it may be preferable to keep the nitrogen concentration higher near the high-k dielectric film, i.e., during the second half of the oxynitriding process, to prevent mutual diffusion between the metal in the dielectric film and the silicon. In accordance with the embodiment of the present invention, therefore, it is possible to form an oxynitride film with varying nitrogen concentration gradient along the direction of the thickness of the oxynitride film, satisfying the aforementioned requirements of the device characteristics.

Next, FIG. 15 shows a fifth exemplary control of the mixture ratio between nitrogen and oxygen showing the timing of the nitrogen introducing valve 31A and the oxygen introducing valve 32A wherein x-axis represents time. The fifth example shown in FIG. 15 is a combination of the first example in FIG. 11 and the third example in FIG. 13.

During period A, which represents the first half of the oxynitriding process right after the start of the feeding, the length of time for which the oxygen valve is open and the interval between the openings of the oxygen valve are, respectively, set to be t1 and S1 as in the first example. During period B, the second half of the oxynitriding process, the length of time for which the oxygen valve is open is maintained at t1 while the interval between the openings of the oxygen valve is adjusted from S1 to S2 (S1<S2). Accordingly, the amount of oxygen mixed is reduced and nitriding reaction in the oxynitride film formation is furthered in the second half, thereby entailing a structure wherein the nitrogen concentration increases in the thickness direction of the oxynitride film.

As shown in the above, it becomes possible to prepare an extremely thin base oxide film and oxynitride film in a one step process while controlling the nitrogen concentration properly by adjusting t and/or S, wherein t is the length of time of the opening of the oxygen introducing valve 32A and S is an interval between onsets of supplying oxygen (an interval between the openings of the oxygen introducing valve 32A).

Further, the way of applying the oxygen radicals to the nitrogen radicals is not limited to the method of adding the oxygen gas to the nitrogen gas. Any combination of gases containing nitrogen and oxygen may be used. For instance, adding NO gas to the nitrogen gas or adding the oxygen gas to NO gas may be possible.

The present invention enables the formation of an extremely thin oxynitride film having a thickness equivalent to 1~3 atomic layers in a one step process on a silicon containing substrate.

Further, the present invention enables the control of the nitrogen concentration as desired in the thickness direction of the oxynitride film.

While the invention has been shown and described with respect to the preferred embodiments, it will be understood by those skilled in the art that various changes and modification may be made without departing from the spirit and scope of the invention as defined in the following claims.

What is claimed is:

1. A method for forming an insulating film on a silicon-containing substrate to be processed, comprising:
    forming a gas mixture by mixing a nitrogen containing gas and an oxygen containing gas, the nitrogen containing gas being a nitrogen gas or a nitrogen compound gas and the oxygen containing gas being an oxygen gas or an oxygen compound gas;
    exciting the gas mixture using a high frequency plasma to produce nitrogen radicals and oxygen radicals;
    supplying the nitrogen radicals and the oxygen radicals to a surface of the substrate; and
    creating an insulating film containing nitrogen using the nitrogen radicals and the oxygen radicals on the surface of the substrate,
    wherein, when the gas mixture is formed, at least one of the oxygen containing gas and the nitrogen containing gas is provided intermittently, and
    wherein, when the gas mixture is formed, a ratio between a gas supplying time and a gas stoppage time for each of said at least one of the oxygen containing gas and the nitrogen containing gas varies with time, the gas supplying time being an amount of time during which each of said at least one of the oxygen containing gas and the nitrogen containing gas is supplied, and the gas stoppage time being an amount of time during which each of said at least one of the oxygen containing gas and the nitrogen containing gas is not supplied.

2. The method of claim 1, the nitrogen radicals and the oxygen radicals are supplied onto the substrate to flow along the surface of the substrate.

3. A method for forming an insulating film on a silicon-containing substrate to be processed, comprising:
    forming a gas mixture of a gas mixture ratio by providing a nitrogen containing gas and an oxygen containing gas to a gas mixing unit, the nitrogen containing gas being a nitrogen gas or a nitrogen compound gas and the oxygen containing gas being an oxygen gas or an oxygen compound gas;
    forming nitrogen radicals and oxygen radicals by providing the gas mixture from the gas mixing unit to a plasma exciting unit; and
    supplying the nitrogen radicals and the oxygen radicals from the plasma exiting unit to a surface of the substrate to form an insulating film containing nitrogen using the nitrogen radicals and the oxygen radicals on the surface of the substrate,
    wherein, when the gas mixture is formed, at least one of the oxygen containing gas and the nitrogen containing gas is provided intermittently to the gas mixing unit, and
    wherein the gas mixture ratio between the oxygen containing gas and the nitrogen containing gas is controlled by adjusting a ratio between a gas supplying time and a gas stoppage time for each of said at least one of the oxygen containing gas and the nitrogen containing gas, the gas supplying time being an amount of time during which each of said at least one of the oxygen containing gas and the nitrogen containing gas is being supplied to the gas mixing unit, and the gas stoppage time being an amount of time during which each of said at least one of the oxygen containing gas and the nitrogen containing gas is not supplied to the gas mixing unit.

* * * * *